United States Patent
Liu et al.

(10) Patent No.: US 9,921,427 B2
(45) Date of Patent: Mar. 20, 2018

(54) METHOD FOR MANUFACTURING COLOR FILTER, COLOR FILTER, AND LIQUID CRYSTAL DISPLAY PANEL

(71) Applicant: SHENZHEN CHINA STAR OPTOELECTRONICS TECHNOLOGY CO., LTD., Shenzhen (CN)

(72) Inventors: Huan Liu, Shenzhen (CN); Jinjie Wang, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/416,387

(22) PCT Filed: Dec. 24, 2014

(86) PCT No.: PCT/CN2014/094827
§ 371 (c)(1),
(2) Date: May 5, 2016

(87) PCT Pub. No.: WO2016/090678
PCT Pub. Date: Jun. 16, 2016

(65) Prior Publication Data
US 2017/0269426 A1    Sep. 21, 2017

(30) Foreign Application Priority Data

Dec. 10, 2014  (CN) .......................... 2014 1 0752141

(51) Int. Cl.
*G02B 5/20*  (2006.01)
*G02F 1/1335*  (2006.01)
*G03F 7/00*  (2006.01)

(52) U.S. Cl.
CPC ....... *G02F 1/133516* (2013.01); *G02B 5/201* (2013.01); *G03F 7/0007* (2013.01); *G02F 2001/133519* (2013.01)

(58) Field of Classification Search
CPC ....... G03F 7/0007; G02B 5/201; G02B 5/223; G02F 1/133514; G02F 1/133516
(Continued)

(56) References Cited

U.S. PATENT DOCUMENTS

| | | | |
|---|---|---|---|
| 2003/0043318 A1* | 3/2003 | Kim .................. | G02F 1/133514 349/106 |
| 2010/0259709 A1* | 10/2010 | Ishigaki ................ | G02F 1/1333 349/106 |
| 2012/0088325 A1* | 4/2012 | Fujiyoshi .......... | G02F 1/133516 438/30 |

FOREIGN PATENT DOCUMENTS

| | | |
|---|---|---|
| CN | 101013224 A | 8/2007 |
| CN | 101449381 A | 6/2009 |

(Continued)

OTHER PUBLICATIONS

International Search Report and Written Opinion (Forms PCT/ISA/210 and PCT/ISA/237) dated Sep. 14, 2015, by the State Intellectual Property Office of the People's Republic of China in corresponding International Application No. PCT/CN2014/094827. (13 pages).

(Continued)

*Primary Examiner* — John A McPherson
(74) *Attorney, Agent, or Firm* — Buchanan Ingersoll & Rooney PC

(57) ABSTRACT

The present invention discloses a method for manufacturing a color filter, a color filter, and a liquid crystal panel. The method comprises: providing a substrate; and forming a plurality of color resistances on the substrate one by one using a color resistance forming process, with boundaries of adjacent color resistances being overlapped with each other.

(Continued)

The color resistance forming process comprises: coating a photoresist material on the substrate to form a color resistance unit thereof; exposing the color resistance unit, with a light intensity received at the boundary of the color resistance unit being smaller than that received by the main body of the color resistance unit. Through the present invention, dark pixel lines at the boundary overlaps can be eliminated, and transmittance of the product can be enhanced.

4 Claims, 5 Drawing Sheets

(58) Field of Classification Search
USPC .............................................. 430/7; 349/106
See application file for complete search history.

(56) References Cited

FOREIGN PATENT DOCUMENTS

| | | |
|---|---|---|
| CN | 101699337 A | 4/2010 |
| CN | 103592710 A | 2/2014 |
| CN | 103901659 A | 7/2014 |
| CN | 104749674 A | 7/2015 |
| JP | 2005-294467 A | 10/2005 |

OTHER PUBLICATIONS

Office Action dated Dec. 17, 2015, by the State Intellectual Property Office of the People's Republic of China in corresponding Chinese Patent Application No. 201410752141.9. (5 pages).

\* cited by examiner

METHOD FOR MANUFACTURING COLOR FILTER, COLOR FILTER, AND LIQUID CRYSTAL DISPLAY PANEL

The present application claims benefit of Chinese patent application CN201410752141.9, entitled "method for manufacturing color filter, color filter, and liquid crystal panel" and filed on Dec. 10, 2014, the entirety of which is incorporated herein by reference.

TECHNICAL FIELD

The present disclosure relates to the technology of liquid crystal display, and in particular, to a method for manufacturing a color filter, a color filter manufactured through the above method, and a liquid crystal panel including the color filter.

TECHNICAL BACKGROUND

Liquid Crystal Displays (LCDs) are superior to traditional CRTs (cathode ray tube) displays in many aspects, such as low voltage operation, no radiation scattering, light weight and small volume. In recent years, LCDs have become a major subject on display research, and are developing towards colorization.

Currently, most color LCDs achieve colorization by a combination of backlight (BL) and color filter (CF). The structure of a color filter is usually as shown in FIG. 1.

FIG. 1 is a sectional view showing the structure of a color filter in the prior art. With reference to FIG. 1, the color filter comprises a first substrate 1, and a color resistance layer which is formed on the surface of the first substrate 1 and includes a red (R) color resistance 21', a green (G) color resistance 22' and a blue (B) color resistance 23'. A second substrate 3 is provided on the surface of the color resistance layer, and on the surface of the second substrate 3, a conductive film 4 is provided. In forming a color resistance, according to the prior art, an ordinary mask completely transparent (with a transmittance rate of 100%) is generally adopted to expose a photoresist material. However, when the color resistance is exposed, the light is not entirely parallel, rendering a slope is formed at the boundary of the color resistance. The shape of an individual color resistance after exposure is shown in FIG. 2.

To avoid the second substrate 3 and the conductive film 4 from being broken and thus generating holes between the color resistances, the boundaries of adjacent color resistances need to be overlapped with each other. The overlapping state of adjacent color resistances is as shown in FIG. 3. However, the overlapped boundaries of adjacent color resistances will produce a bulge, which is called horn 24'. Because of the existence of the horn 24', on the one hand, the conductive film 4 protrudes here, so that a line width/line space for the slot of the conductive film will be deviated from normal value, and thus the light transmittance is decreased. On the other hand, the liquid crystals will present chaotic orientations here, which will easily cause dark lines at the pixel edges in the display device.

SUMMARY OF THE DISCLOSURE

The technical problem essentially to be solved by the present disclosure is horns formed in the color resistance layer of the existing color filter, because of which a display device is prone to appear dark lines at the pixel edges.

To solve the above technical problem, a method for manufacturing a color filter is provided in the present disclosure, aiming to effectively eliminate the dark lines appeared at the pixel edges.

According to one aspect of the present disclosure, a method for manufacturing a color filter is provided, comprising: providing a substrate; and forming a plurality of color resistances on the substrate one by one using a color resistance forming process, with boundaries of adjacent color resistances being overlapped with each other. The color resistance forming process comprises: coating a photoresist material on the substrate to form a color resistance unit thereof; exposing the color resistance unit, with a light intensity received at the boundary of the color resistance unit being smaller than that received by the main body of the color resistance unit; and developing the color resistance unit to form a color resistance.

Preferably, the step of exposing the color resistance unit includes: exposing the color resistance unit using a half-tone mask, which comprises a first region and a second region corresponding to the boundary and the main body of the color resistance unit respectively, the first region with a light transmittance being less than that of the second region.

Preferably, the light transmittance of the first region is 10-90%, while that of the second region is 100%.

Preferably, the step of exposing the color resistance unit comprises: exposing the color resistance unit through a mask with a light transmittance of 100%, the mask including a third region and a fourth region corresponding to the boundary and the main body of the color resistance unit respectively, wherein a light shading portion is provided in the third region, so that the light shading rate of the third region is larger than that of the fourth region.

Preferably, the light shading portion is in a structure of matrix, strip, or mesh.

Preferably, the light shading rate of the fourth region is 0%.

Preferably, the step of exposing the color resistance unit further comprises: enabling the light intensity received by the third region being uniform by adjusting the light shading rate of the third region and the parallelism of light passing through the third region during the exposing procedure.

Preferably, the parallelism of light can be adjusted by adjusting the numerical aperture of an exposing machine.

As per another aspect of the present disclosure, a color filter manufactured using the above-mentioned method is also provided.

As per a further aspect of the present disclosure, a liquid crystal panel including the above-mentioned color filter is further provided.

As compared with the prior art, one or more embodiments provided in the above technical solution could have the following advantages or beneficial effects:

In the preparation method according to the above embodiment, when the color resistance unit is exposed, the color resistance can have a thinner boundary after exposure and development through reducing the light intensity of exposure at the boundary of the color resistance unit, so that the horns generated at the boundaries where adjacent color resistances overlap with each other (boundary overlap) can be reduced or eliminated. The functions of reducing or eliminating the horns at least comprises the following two aspects: (1) enabling the line width/line space of the slot of the conductive film at the overlapped boundaries suffers no deviation, and thus returns back to its normal value; and (2) avoiding chaotic orientations of the liquid crystals at the overlapped boundaries. Both functions could mitigate the dark pixel lines at the overlapped boundaries, and thereby increase the transmittance of the product.

Other features and advantages of the present disclosure will be further explained in the following description, and partly become self-evident therefrom, or be understood through implementing the present disclosure. The objectives and advantages of the present disclosure will be achieved through the structure specifically pointed out in the description, claims, and the accompanying drawings.

BRIEF DESCRIPTION OF THE DRAWINGS

The drawings are provided for further understanding of the present disclosure, and constitute one part of the description. They serve to explain the present disclosure in conjunction with the embodiments, rather than to limit the present disclosure in any manner. In the drawings.

DETAILED DESCRIPTION OF THE EMBODIMENTS

The present disclosure will be explained by reference to the following detailed description of embodiments taken in connection with the accompanying drawings, whereby it can be readily understood how to solve the technical problem by the technical means according to the present disclosure and achieve the technical effects thereof, and thus the technical solution according to the present disclosure can be implemented. It is important to note that as long as there is no conflict, combinations of the above-described embodiments and of technical features therein are possible, and technical solutions obtained in this manner are intended to fall within the scope of the present disclosure.

In order to solve the technical defect of the existing color filter, i.e., the color resistance layer of the existing color filter has horns, which will easily cause dark lines at pixel edges in the display device, an embodiment of the present disclosure provides a method manufacturing a color filter.

Specifically, the method for manufacturing a color filter comprises, first, providing a substrate, then forming a plurality of color resistances one by one on the substrate using a color resistance forming process (which will be described in detail in the following text), with boundaries of adjacent color resistances overlapped with each other. For example, using the color resistance forming method, a red (R) color resistance, a green (G) color resistance, and a blue (B) color resistance are formed one by one on the substrate from left to right, wherein the boundary of the red color resistance is overlapped with that of the green color resistance, and the boundary of the green color resistance is overlapped with that of the blue color resistance. It should be noted that the coating sequence of color resistances is not limited to the sequence as R, G and B.

To decrease horns caused by overlapped boundaries of adjacent color resistances, each color resistance should be prepared by adopting the color resistance forming method below. Through this method, a downward depression will be produced at the boundary of each color resistance (especially in overlapped boundaries with other color resistances). Therefore, the thickness of common boundaries, where adjacent color resistances overlap with each other, can be decreased, so that horns can be reduced or eliminated.

Figure 4:
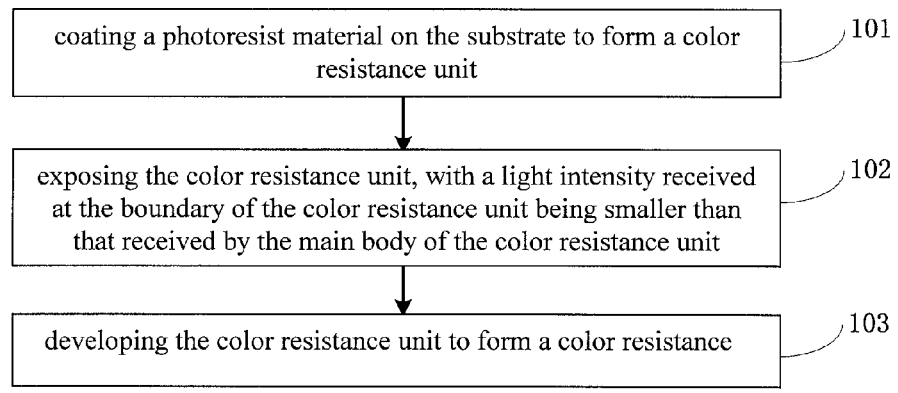
FIG. 4 is a flowchart of the color resistance forming procedure of a method for manufacturing a color filter according to an embodiment of the present disclosure.

FIG. 4 is a flowchart for the color resistance forming process in the method for manufacturing a color filter according to an embodiment of the present disclosure, the color resistance forming process comprising the following steps:

In Step 101, a photoresist material is coated on the substrate to form a color resistance unit.

In Step 102, the color resistance unit is exposed, with the light intensity received at the boundary of the color resistance unit being smaller than that received by the main body of the color resistance unit.

Specifically, the color resistance unit should be exposed after it is formed. The following conditions need to be satisfied in the exposing procedures: ensuring a light intensity received at the boundary of the color resistance unit is smaller than that received by the main body of the color resistance unit. The lower the intensity of light used in exposing the color resistance unit, the smaller is the thickness of the color resistance obtained after exposure and development. For this reason, the overlapped boundaries of the color resistances can be intentionally reduced in thickness, so as to achieve the purpose of reducing or eliminating horns. Exposing the color resistance unit will be described in detail with reference to FIG. 5 to FIG. 8 in the following text.

In Step 103, the color resistance unit is developed to form a color resistance.

Specifically, after targeted exposure and development are performed for a color resistance unit one by one, a color resistance with a thinner boundary (especially the overlapped boundary with other color resistances) and a thicker main body (referring to the remaining part in the whole color resistance except the boundary) can be formed.

In the preparation method according to the above embodiment, when the color resistance unit is exposed, the color resistance can have a thinner boundary after exposure and development through reducing the light intensity of exposure at the boundary of the color resistance unit, so that the horns generated at the boundaries where adjacent color resistances overlap with each other (boundary overlap) can be reduced or eliminated. The functions of reducing or eliminating the horns at least comprises the following two aspects: (1) enabling the line width/line space of the slot of the conductive film at the overlapped boundaries suffers no deviation, and thus returns back to normal value; and (2) avoiding chaotic orientation of the liquid crystals at the overlapped boundaries. Both functions could mitigate the dark pixel lines at the overlapped boundaries, and thereby increase the transmittance of the product.

Figure 5:
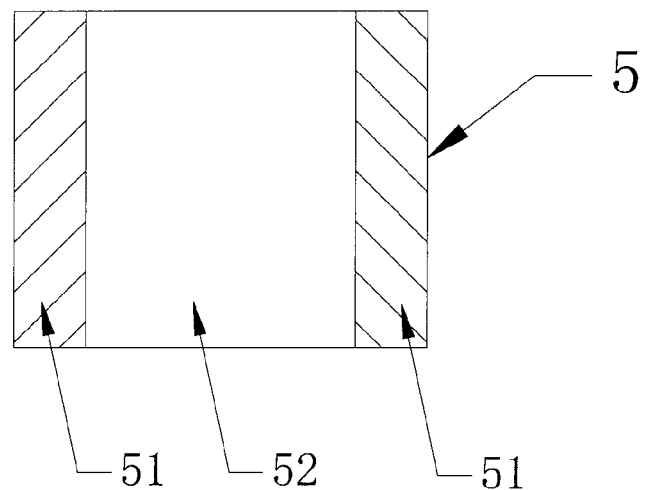
FIG. 5 schematically shows a structural diagram for a half-tone mask used in exposing the color resistance unit according to an embodiment of the present disclosure.

In a preferred embodiment of the present disclosure, the specific procedure for exposing the color resistance unit comprises exposing the color resistance unit with a half-tone mask (HTM), which comprises a first region and a second region corresponding to the boundary and the main body of the color resistance unit respectively, the first region with a light transmittance less than that of the second region. FIG. 5 schematically shows a structural view of a half-tone mask. The half-tone mask 5 comprises three regions: two first regions 51, and a second region 52 arranged between the two first regions 51. In exposing a color resistance unit, the first regions 51 correspond to two sides of the boundary of the color resistance unit, while the second region 52 corresponds to the main body of the color resistance unit. Besides, to decrease the thickness of color resistance formed after exposure and development, it is necessary to lower the light transmittance of the first region 51, while the light transmittance of the second region 52 requires no adjustment, that is, the light transmittance of the second region 52 remains at 100%. In a preferred embodiment of the present disclosure, the adjustment range of the light transmittance of the first region 51 is 10-90%. For example, the light transmittance of the first region 51 can be adjusted to be 40%.

Figure 1:
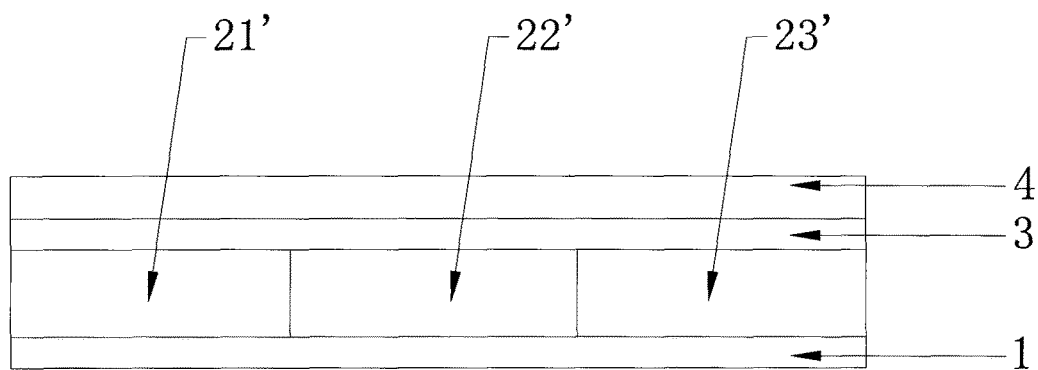
FIG. 1 schematically shows a sectional view for a color filter in the prior art.
Figure 2:
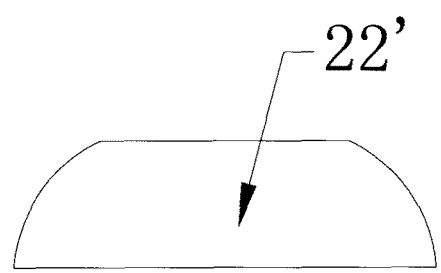
FIG. 2 schematically shows a sectional view of an individual color resistance after exposure.
Figure 3:
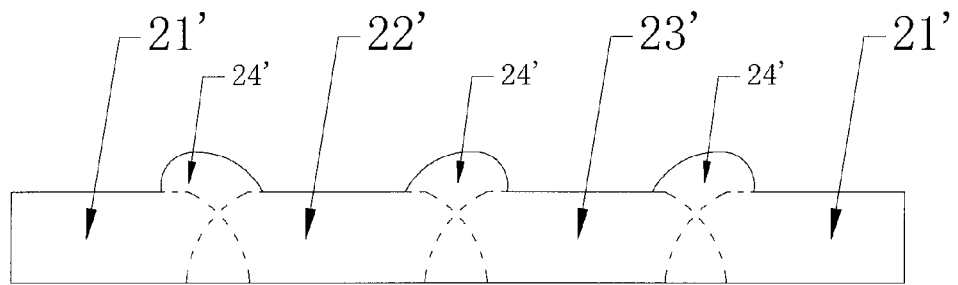
FIG. 3 schematically shows a sectional view of the color resistance layer as indicated in FIG. 1.
Figure 7:
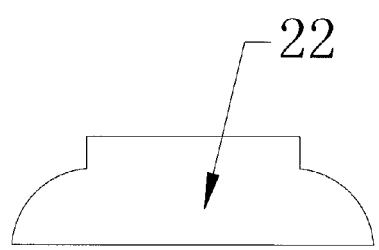
FIG. 7 schematically shows a sectional view for a color resistance manufactured as per the method as indicated in FIG. 4.
Figure 8:
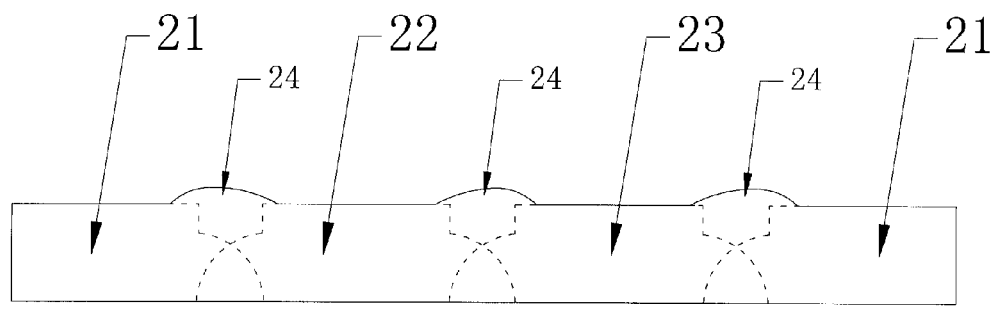
FIG. 8 schematically shows a sectional view for a color resistance layer manufactured as per the method as indicated in FIG. 4.

In this embodiment, a half-tone mask 5 is adopted, wherein the light transmittance of the mask corresponding to the main body of the color resistance unit shall be designed as 100%, while the transmittance of the mask corresponding to two sides of the boundary of the color resistance unit shall be designed as less than 100% (for example, 40%). Hence, in the exposing procedure, the light intensity in the main body of color resistance unit is stronger, while that in the boundary part of two sides is weaker, so that an individual color resistance after exposure has a shape as shown in FIG. 7, wherein the boundary of the color resistance is downward depressed, with a thickness obviously thinner. Therefore, the horns 24 generated at the overlapped boundaries of adjacent color resistances can be reduced or eliminated. As shown in FIG. 8, the horn 24 at the overlapped boundary of adjacent red color resistance 21 and green color resistance 22 is obviously decreased than the horn 24' as shown in FIG. 3, and the horn 24 at the overlapped boundaries of adjacent green color resistance 21 and blue color resistance 22 is obviously decreased than the horn 24' as shown in FIG. 3. It should be noted that, by adjusting the light transmittance in the first region 51 of the half-tone mask 5, the horn 24 can be removed or minimized, so as to reduce dark lines as far as possible.

Figure 6A:
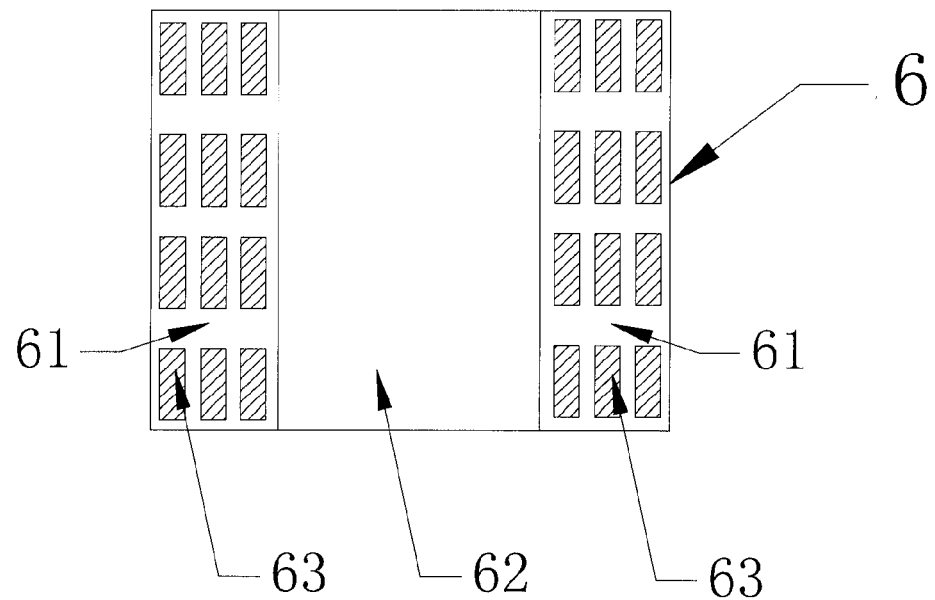
FIG. 6a to FIG. 6c schematically show three structures for a half-tone mask used in exposing the color resistance unit according to embodiments of the present disclosure, respectively.
Figure 6B:
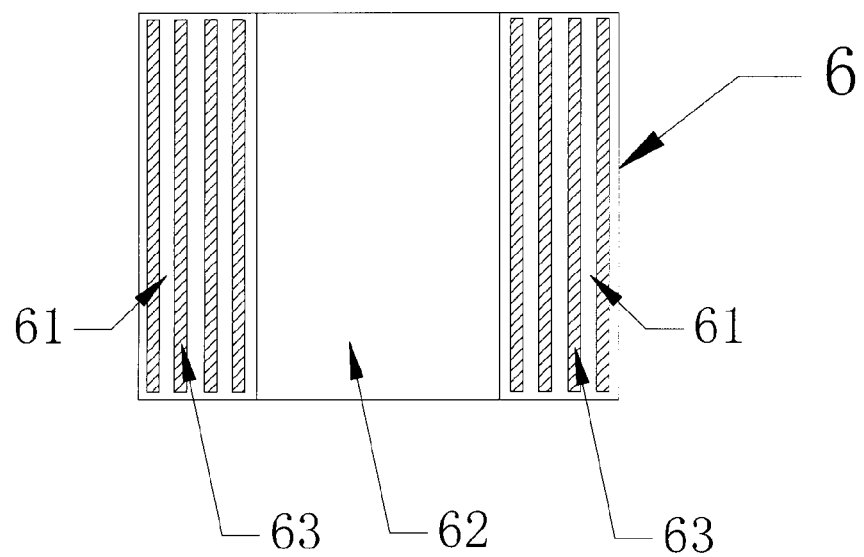
Figure 6C:
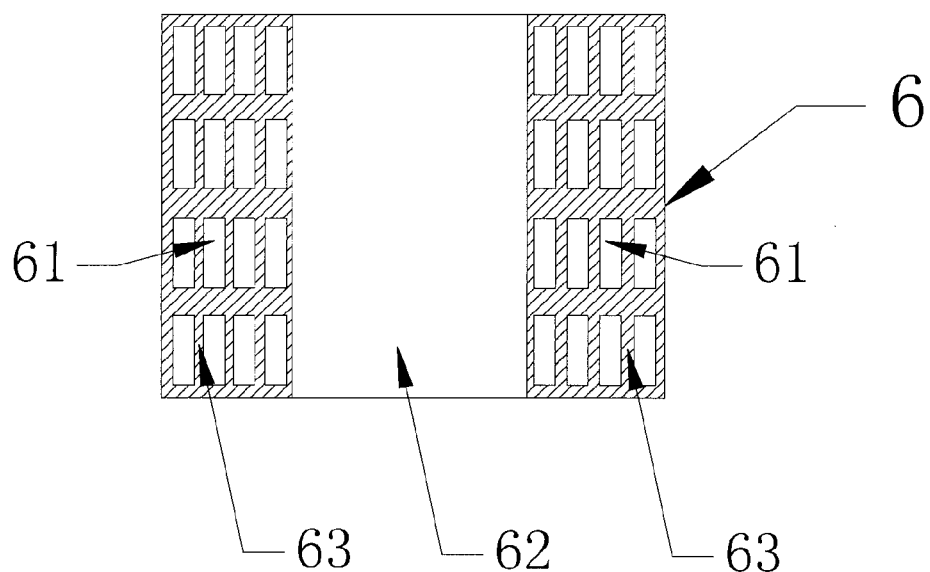

According to another embodiment of the present disclosure, the above exposing procedure for a color resistance unit comprises: exposing the color resistance unit through a mask with a light transmittance of 100% (an ordinary mask), the mask including a third region and a fourth region corresponding to the boundary and the main body of the color resistance unit respectively, wherein a light shading portion is provided in the third region, so that the light shading rate of the third region is larger than that of the fourth region. FIG. 6a to FIG. 6c schematically shows three structures for the light shading portion. As shown in FIG. 6a to FIG. 6c, the mask 6 includes three regions: two third regions 61, and a fourth region 62 arranged between the two third regions 61. In exposing the color resistance unit, the third regions 61 correspond to two sides of the boundary of the color resistance unit, while the fourth region 62 corresponds to the main body of the color resistance unit. Besides, to decrease the thickness of the color resistance formed after exposure and development, it is necessary to provide a light shading portion 63 with a transmittance of light of 0% in each third region 61. Through adjustment of the light shading area of the light shading portion 63, the light intensity received by the third regions 61 can be adjusted. At the same time, no light shading portion is provided in the fourth region 62, so as to ensure the light intensity of the fourth region 62 received, that is, the light shading rate of the fourth region 62 is 0%.

In a preferred embodiment of the present disclosure, the light shading portion 63 provided in the third regions 61 is further modified in its shape. Specifically, with reference to FIG. 6a, the light shading portion 63 is in a matrix structure, that is, the light shading portion 63 is composed of a plurality of sub light shading portions with 0% light transmittance, and these sub light shading portions 63 are arranged in a matrix structure. With reference to FIG. 6b, each light shading portion 63 is in a strip structure, that is, each light shading portion 63 is composed of a plurality of sub light shading portions 63 with 0% light transmittance, and the sub light shading portions 63 of strip shape are arranged side by side at equal intervals. As shown in FIG. 6c, the light shading portions 63 form a mesh structure.

According to the present embodiment, an ordinary mask is adopted, wherein the part of the mask corresponding to the main body of the color resistance unit experiences no light shading treatment, while the other part of the mask corresponding to the boundary at two sides of the color resistance unit experiences light shading treatment. Since the light is not entirely parallel in the exposing procedure and thus diverges to a certain degree, after the exposure, the average light intensity at two sides of the boundary would be smaller than that of the main body. Therefore, an individual color resistance after exposure has a shape as indicated in FIG. 7, the boundary of which is downward depressed, with a thickness obviously thinner. As shown in FIG. 8, the horn 24 at the overlapped boundary of adjacent red color resistance 21 and green color resistance 22 is obviously decreased than the horn 24' as shown in FIG. 3, and the horn 24 at the overlapped boundaries of adjacent green color resistance 21 and blue color resistance 22 is obviously decreased than the horn 24' as shown in FIG. 3. It should be noted that, the greater is the light shading rate, the smaller is the thickness of the color resistance obtained after exposure and development. Hence, through adjustment of the light shading rate for the third region 61 of mask 6, horn 24 can be removed or the generated horn 24 can be minimized, so as to reduce dark lines as far as possible, and improve the transmittance of product.

Besides, it should also be noted that, by adjusting the parallelism and intensity of light in the exposing procedure, the light intensity at the boundaries can achieve a uniform distribution. Therefore, in a preferred embodiment according to the present disclosure, the process for exposing the color resistance unit also comprises: enabling the third region 61 to receive a uniform light intensity through adjustment of the light shading rate of the third regions 61 and the parallelism of light passing through the third regions 61 in the exposing procedures. Specifically, parallelism of light can be adjusted by adjusting the numerical aperture of the exposing machine.

Correspondingly, preferred embodiments according to the present disclosure further provide a color filter manufactured by the above method, and a liquid crystal panel including the above color filter.

The above embodiments are described only for better understanding, rather than restricting the present disclosure. Any person skilled in the art can make amendments to the implementing forms or details without departing from the spirit and scope of the present disclosure. The scope of the present disclosure should still be dependent on the scope as defined in the claims.

The invention claimed is:

1. A method for manufacturing a color filter, comprising:
providing a substrate; and
forming a plurality of color resistances on the substrate one by one using a color resistance forming process, with boundaries of adjacent color resistances being overlapped with each other,
wherein the color resistance forming process comprises:
coating a photoresist material on the substrate to form a color resistance unit thereof;
exposing the color resistance unit, with a light intensity received at the boundary of the color resistance unit being smaller than that received by the main body of the color resistance unit; and
developing the color resistance unit to form a color resistance,
wherein the step of exposing the color resistance unit comprises:
exposing the color resistance unit through a mask with a light transmittance of 100%, the mask including a third region and a fourth region corresponding to the boundary and the main body of the color resistance unit respectively, wherein a light shading portion is provided in the third region, so that the light shading rate of the third region is larger than that of the fourth region, and
enabling the light intensity received by the third region being uniform by adjusting the light shading rate of the third region and the parallelism of light passing through the third region during the exposing procedure.

2. The method according to claim 1, wherein the parallelism of light is adjusted through adjustment of the numerical aperture of an exposing machine.

3. The method according to claim 1, wherein the light shading portion is in a structure of matrix, strip, or mesh.

4. The method according to claim 1, wherein the light shading rate of the fourth region is 0%.

* * * * *